(12) United States Patent
Kvisteroy et al.

(10) Patent No.: US 7,535,156 B2
(45) Date of Patent: May 19, 2009

(54) ENERGY SCAVENGER AND METHOD FOR MANUFACTURING THE SAME

(75) Inventors: Terje Kvisteroy, Horten (NO); Terje Skog, Nykirke (NO)

(73) Assignee: Infineon Technologies SensoNor AS, Horten (NO)

( * ) Notice: Subject to any disclaimer, the term of this patent is extended or adjusted under 35 U.S.C. 154(b) by 55 days.

(21) Appl. No.: 11/687,150

(22) Filed: Mar. 16, 2007

(65) Prior Publication Data

US 2007/0228889 A1    Oct. 4, 2007

(30) Foreign Application Priority Data

Mar. 28, 2006    (EP)    ................................. 06111849

(51) Int. Cl.
*H01L 41/113*    (2006.01)
(52) U.S. Cl. ........................ 310/339; 310/324; 310/329; 310/332
(58) Field of Classification Search ................. 310/324, 310/329, 331, 332, 339, 340, 345, 351, 353
See application file for complete search history.

(56) References Cited

U.S. PATENT DOCUMENTS

| | | | | |
|---|---|---|---|---|
| 3,500,451 A | * | 3/1970 | Yando | 310/330 |
| 3,967,141 A | * | 6/1976 | Gawlick et al. | 310/339 |
| 4,952,836 A | * | 8/1990 | Robertson | 310/339 |
| 6,198,205 B1 | * | 3/2001 | Oberlin et al. | 310/339 |
| 6,246,155 B1 | * | 6/2001 | Nishihara et al. | 310/328 |
| 6,750,596 B2 | * | 6/2004 | Kim et al. | 310/339 |
| 6,954,025 B2 | * | 10/2005 | Nishida et al. | 310/339 |
| 7,023,100 B2 | * | 4/2006 | Vlad | 290/1 R |
| 2005/0093398 A1 | * | 5/2005 | Kim et al. | 310/324 |
| 2006/0119224 A1 | * | 6/2006 | Keolian et al. | 310/339 |

* cited by examiner

*Primary Examiner*—Thomas M Dougherty
(74) *Attorney, Agent, or Firm*—Edell, Shapiro & Finnan, LLC

(57) ABSTRACT

A micro-electromechanical package includes a casing and a microelectronic circuit. At least one portion of the casing includes a piezoelectric material arranged such that, in use, dynamically changing mechanical strain in the at least one portion produces an electrical charge usable as a power source by the microelectronic circuit.

13 Claims, 6 Drawing Sheets

ENERGY SCAVENGER AND METHOD FOR MANUFACTURING THE SAME

CROSS REFERENCE TO RELATED APPLICATIONS

This application claims priority under 35 U.S.C. §119 to Application No. EP 06111849.3 filed on Mar. 28, 2006, entitled "Energy Scavenger," the entire contents of which are hereby incorporated by reference.

FIELD OF THE INVENTION

The present invention relates to the area of energy scavenging and particularly to a piezoelectric energy scavenger.

BACKGROUND

Energy scavengers, also sometimes known as energy harvesters are increasingly used in electronic systems to reduce the strain on main power sources or, in some cases, to act as main sources of power.

An energy scavenger is a device which converts ambient energy, which would otherwise be wasted, into energy which can be used for a specific purpose. Energy scavengers may be used in a wide variety of applications ranging from indirectly powering emergency telecommunication equipment to powering microelectronic sensors.

A system for indirectly powering telecommunication devices could, for example, comprise a solar panel which would help charge a battery connected to a stationary emergency wireless telephone box located on the side of a remote motorway. Unfortunately, solar power is not always ideal for powering microelectronic circuits in that, often, these circuits are found in relatively dark places.

However, many micro electronic devices, such as acceleration sensors or passive sensors are constantly being exposed to kinetic forces. Consequently, kinetic energy scavengers have been developed to harness a part of the residual ambient energy caused by the acceleration, vibration or dynamic compression of a device.

Kinetic energy scavengers may harness vibratory energy using piezoelectric devices, thereby converting strain in a material into electrical impulses. These devices can be used in a wide variety of applications.

Most energy scavengers comprise multiple interconnected parts which are assembled in a package in order to protect the highly sensitive parts from environmental conditions. This has numerous drawbacks. The first of which is that the multiple interconnected parts must be assembled and placed in the package itself. Thus, known energy scavengers are expensive and difficult to manufacture. What is needed is an energy scavenger which comprises few parts and is thereby cheaper and easier to manufacture.

One fundamental challenge with energy scavengers for kinetic energy is the need for large seismic masses or large diaphragms to reach certain levels of efficiency. A second fundamental challenge for piezoelectric energy scavengers is that the efficiency is directly related to the amount of piezoelectric material that is exposed to resulting high strains. Thus, the efficiency of the scavenger is directly related to the volume and/or area of the device.

There is a need to for an energy scavenger which maximizes the piezoelectric material exposed to high strain while minimizing the complexity of the microelectronic system itself.

SUMMARY

A micro-electromechanical package according to the present invention includes a casing and a microelectronic circuit. At least one portion of the casing includes a piezoelectric material arranged such that, in use, dynamically changing mechanical strain in the at least one portion produces an electrical charge usable as a power source by the microelectronic circuit.

The at least one portion of the casing can comprise at least one outer wall of the casing. The at least one outer wall of the casing may comprise an inertial mass formed as part of the casing.

The at least one portion of the casing may comprise a cantilever arm, and the cantilever arm may comprise an inertial mass.

Electrode layers can be embedded in the piezoelectric material such that, in use, they collect the electrical charges produced by the piezoelectric material.

The casing may be made of Aluminum Nitride.

The microelectronic circuit may further comprise at least one of: a power management circuit; a power storage circuit; and a micro-electromechanical sensor circuit.

The present invention further provides a method of manufacturing the micro-electromechanical package of the types described above. The method involves forming the MEMS package using a ceramic multi-layering technique or a polymer molding technique.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

Exemplary embodiments of an energy scavenger device according to the present invention, and methods for manufacturing the same, will now be described with reference to the accompanying drawings in which.

DETAILED DESCRIPTION

Figure 1:
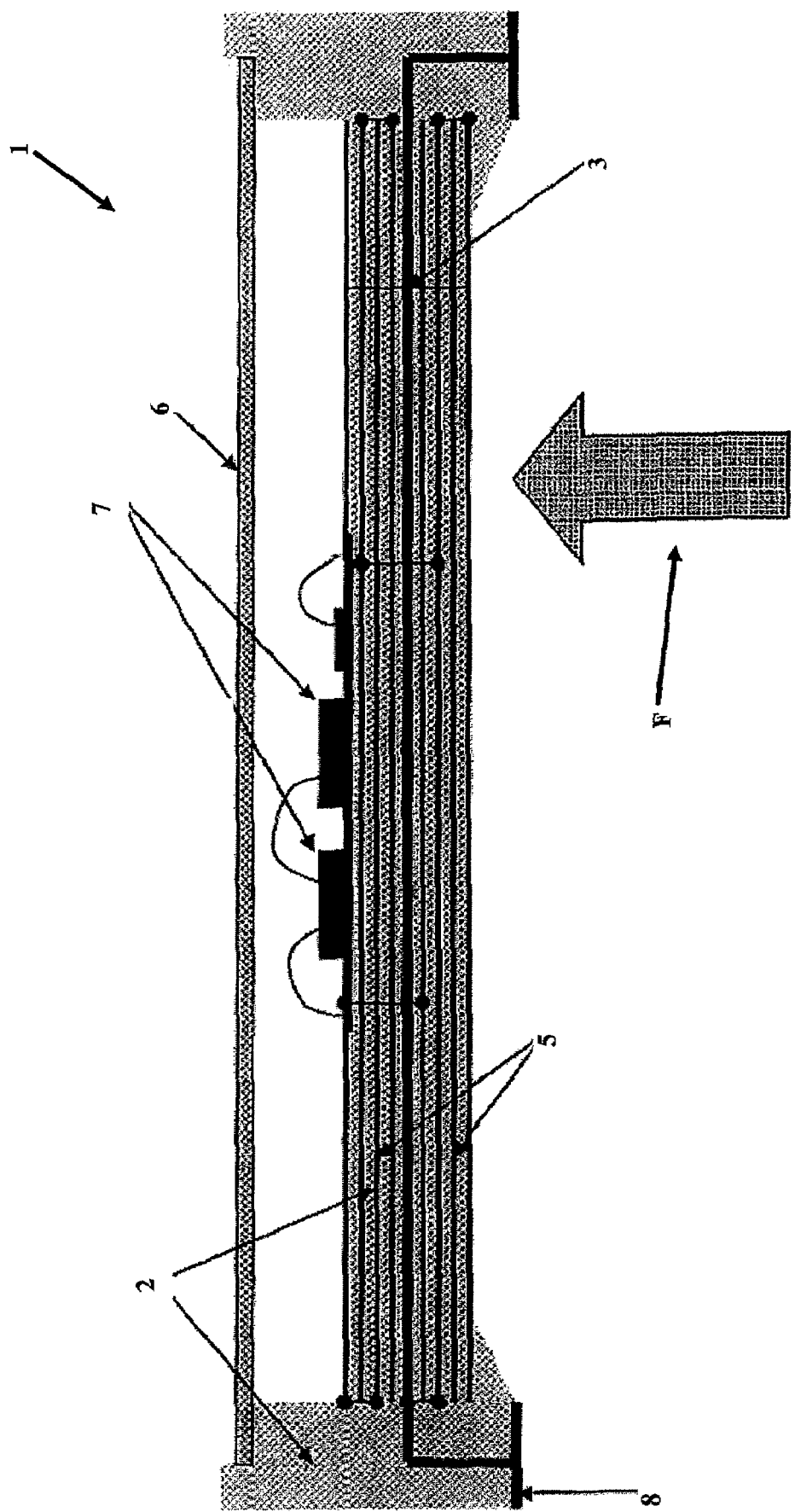
FIG. 1 is a cross-sectional view of a micro-electromechanical package according to a first embodiment of the present invention.

With reference to FIG. 1, an energy scavenger device in the form of a micro-electromechanical package 1 according to an exemplary embodiment of the present invention includes a casing comprising piezoelectric material 2 and a diaphragm 3 including electrodes 5 interleaved with layers of the piezoelectric material 2. The electrodes 5 collect the electrical charge produced in the piezoelectric material 2 layers of the diaphragm 3.

The micro-electromechanical package 1 may also comprise a variety of electronic circuits 7. These may include, for example, power management and power storage circuits as well as micro-electromechanical sensors. The micro-electromechanical package 1 of the energy scavenger device may also comprise solder terminals 8 for connecting the package to a substrate (not shown) and a lid 6 for shielding the electronic circuits 7.

With reference to the embodiment shown in FIG. 1, an external force F acting upon the diaphragm will create mechanical strain in the interleaved layers of piezoelectric material 2 included in the diaphragm 3. Consequently, the piezoelectric layers generate charges which are collected by the electrodes 5 and sent to the electronic circuits 7 or, alternatively, to the substrate (not shown) via the solder terminals 8.

Thus, the energy scavenger device found in the embodiment of FIG. 1 collects the energy related to the external force F applied directly to the micro-electromechanical package 1 itself. A possible application for which this particular embodiment of the energy scavenger device would be well suited is, for example, that of a sensor integrated into the rubber of a tire. Each time the appropriate surface of the tire hits and leaves contact with the road surface the diaphragm will either be compressed or decompressed and the piezoelectric material will be strained.

Figure 2:
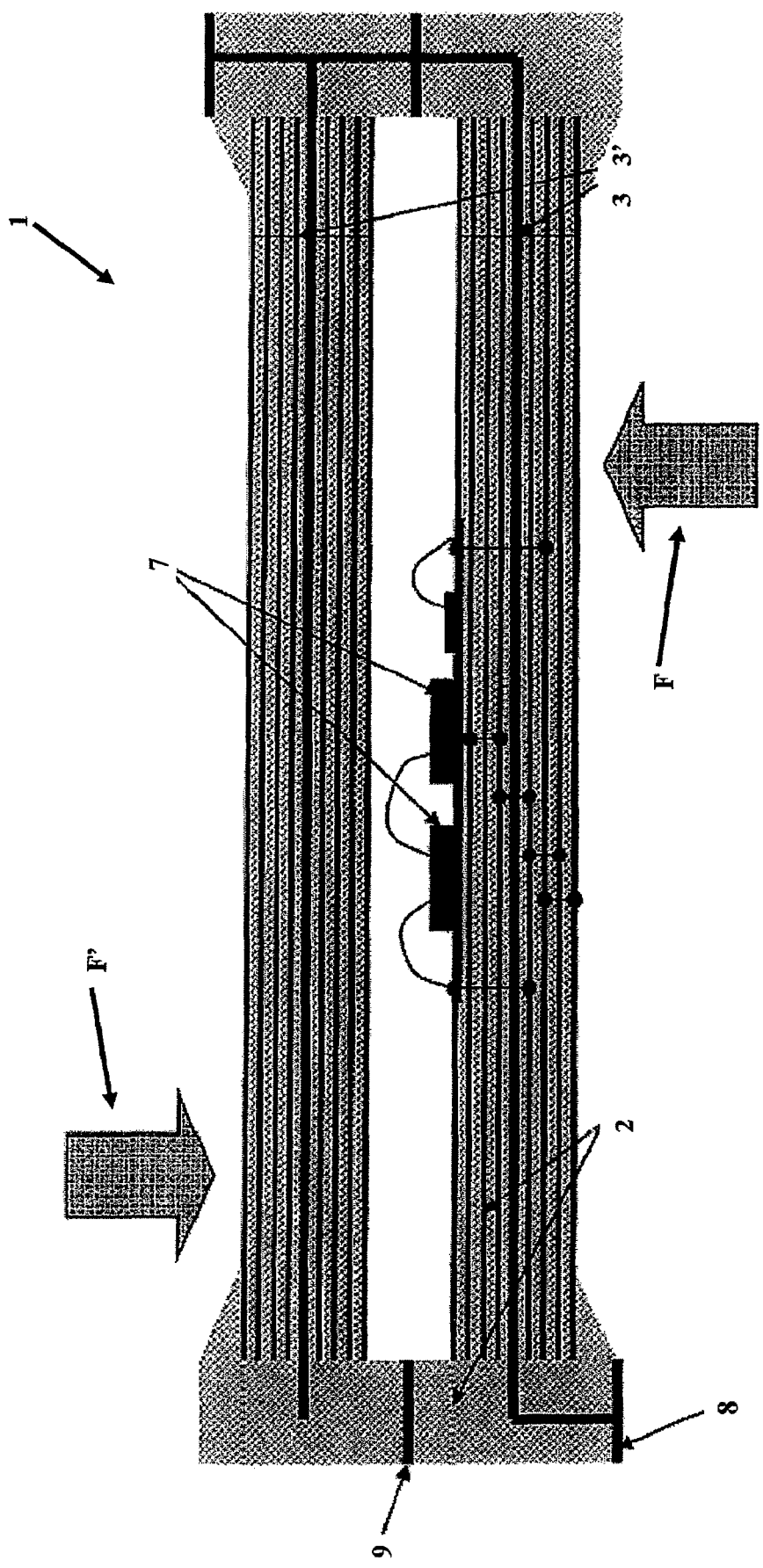
FIG. 2 is a cross-sectional view of a micro-electromechanical package according to a second embodiment of the present invention.

With reference to the embodiment shown in FIG. 2, a first external force F is applied to a first diaphragm 3 and a second external force F' is applied to a second diaphragm 3'. Both diaphragms 3; 3' function in the same way as the diaphragm of the embodiment shown in FIG. 1. The metal bond 9 is used to hermetically join the two parts of the package. One reliable method of making such a bond, for example, would be using a metal-to-metal bonding technique.

Figure 3:
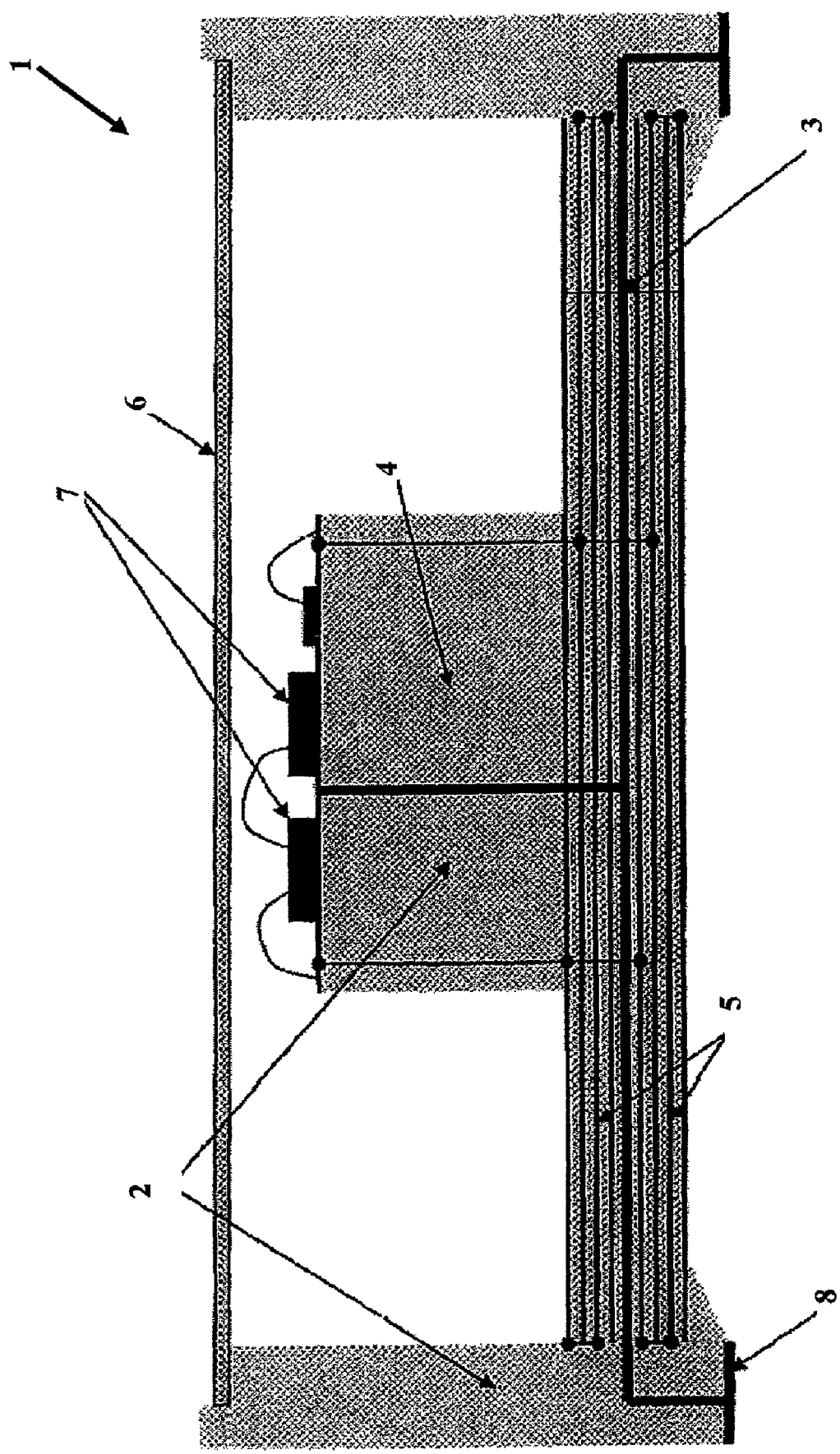
FIG. 3 is a cross-sectional view of a micro-electromechanical package according to a third embodiment of the present invention.

With reference now to the embodiment shown in FIG. 3, the micro-electromechanical package 1 according to another exemplary embodiment of the present invention comprises a casing made of piezoelectric material 2 and a diaphragm 3 comprised of electrodes 5 interleaved with layers of the piezoelectric material 2. Again, the electrodes 5 collect the electrical charge produced in the piezoelectric material layers of the diaphragm 3.

This particular embodiment further comprises an inertial mass 4 located inside the package and formed at the center of the diaphragm 3. Thus, when the micro-electromechanical package 1 is moved or vibrated, the inertial mass 4 is used to amplify the strain in the piezoelectric material 2 in the diaphragm 3. In this case, the diaphragm acts as the elastic spring element of a mass-spring system. A possible application for which this particular embodiment of the energy scavenger device would be well suited is, for example, that of sensors integrated onto the wheel of a car. When the car is driving the wheel will vibrate and the casing mounted to the wheel will feel the same vibrations. The mass-spring system will vibrate and the piezoelectric material will be strained.

Figure 4:
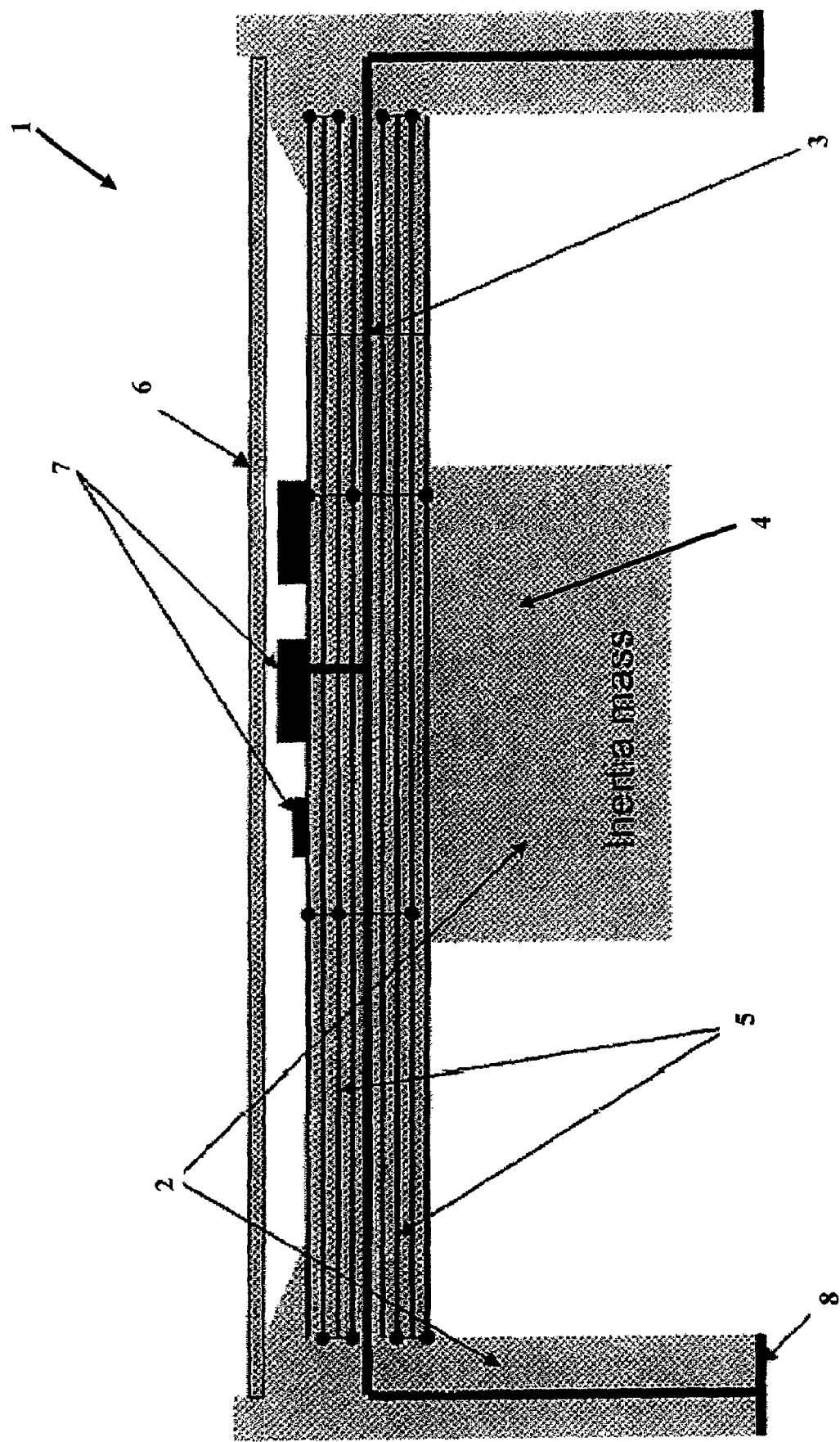
FIG. 4 is a cross-sectional view of a micro-electromechanical package according to a fourth embodiment of the present invention.

With reference now to the embodiment shown in FIG. 4, the micro-electromechanical package 1 according to another exemplary embodiment of the present invention can comprise an inertial mass 4 located outside of the package and formed at the center of the diaphragm 3. This particular embodiment of the energy scavenger device may provide advantages related to manufacturing costs and application integration.

Figure 5:
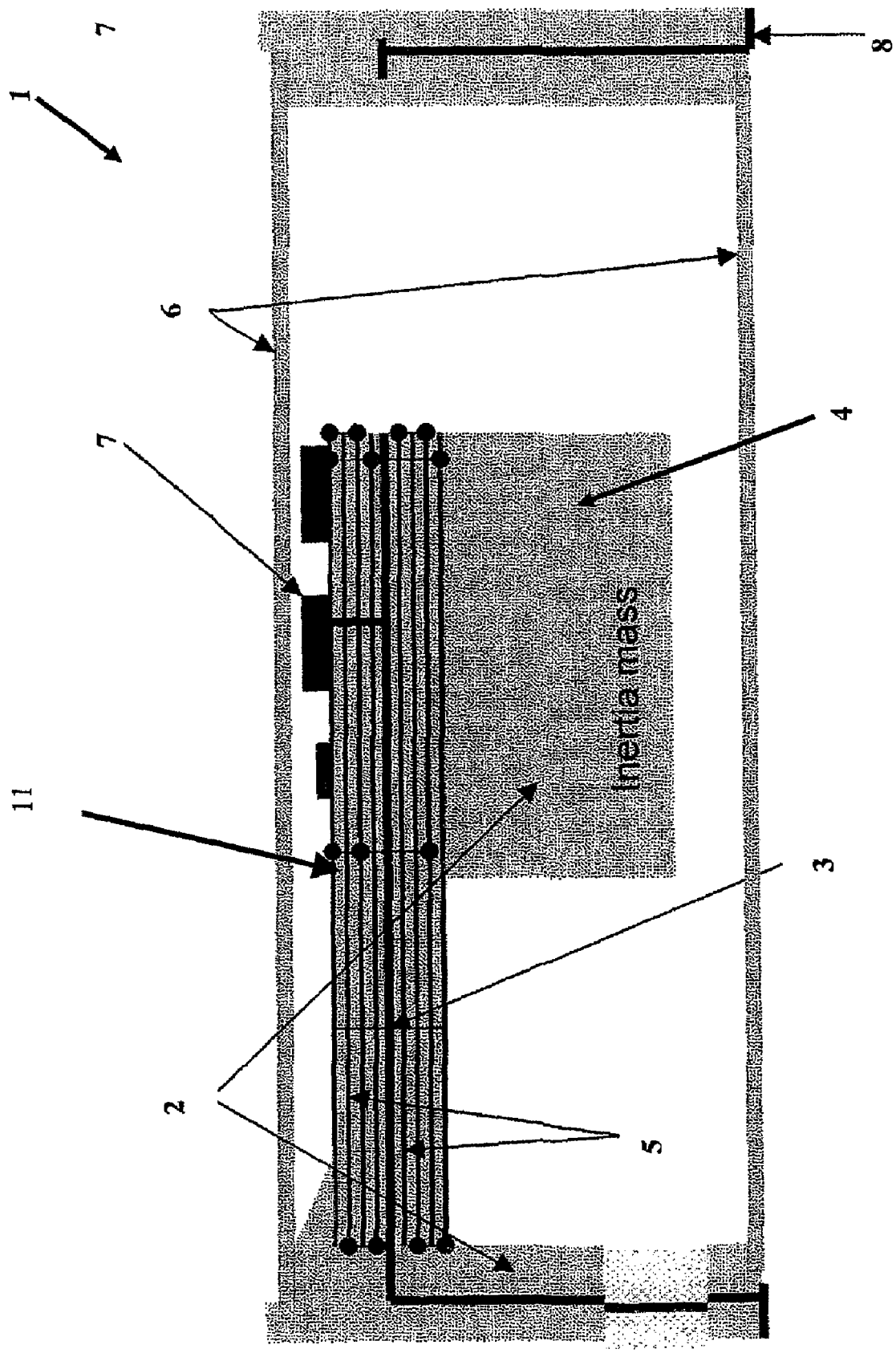
FIG. 5 is a cross-sectional view of a micro-electromechanical package according to a fifth embodiment of the present invention.

With reference now to the embodiment shown in FIG. 5, the micro-electromechanical package 1 according to another exemplary embodiment of the present invention may comprise a cantilever arm 11 integrally formed with one wall of the micro-electromechanical package 1. The cantilever arm 11 also includes an inertial mass 4 formed at the free end of the cantilever arm 11. This particular embodiment of the energy scavenger device will provide a significant advantage when no displacement or movement of any outer wall of the casing is possible (e.g., when the component is potted or encased in hard epoxy).

Figure 6:
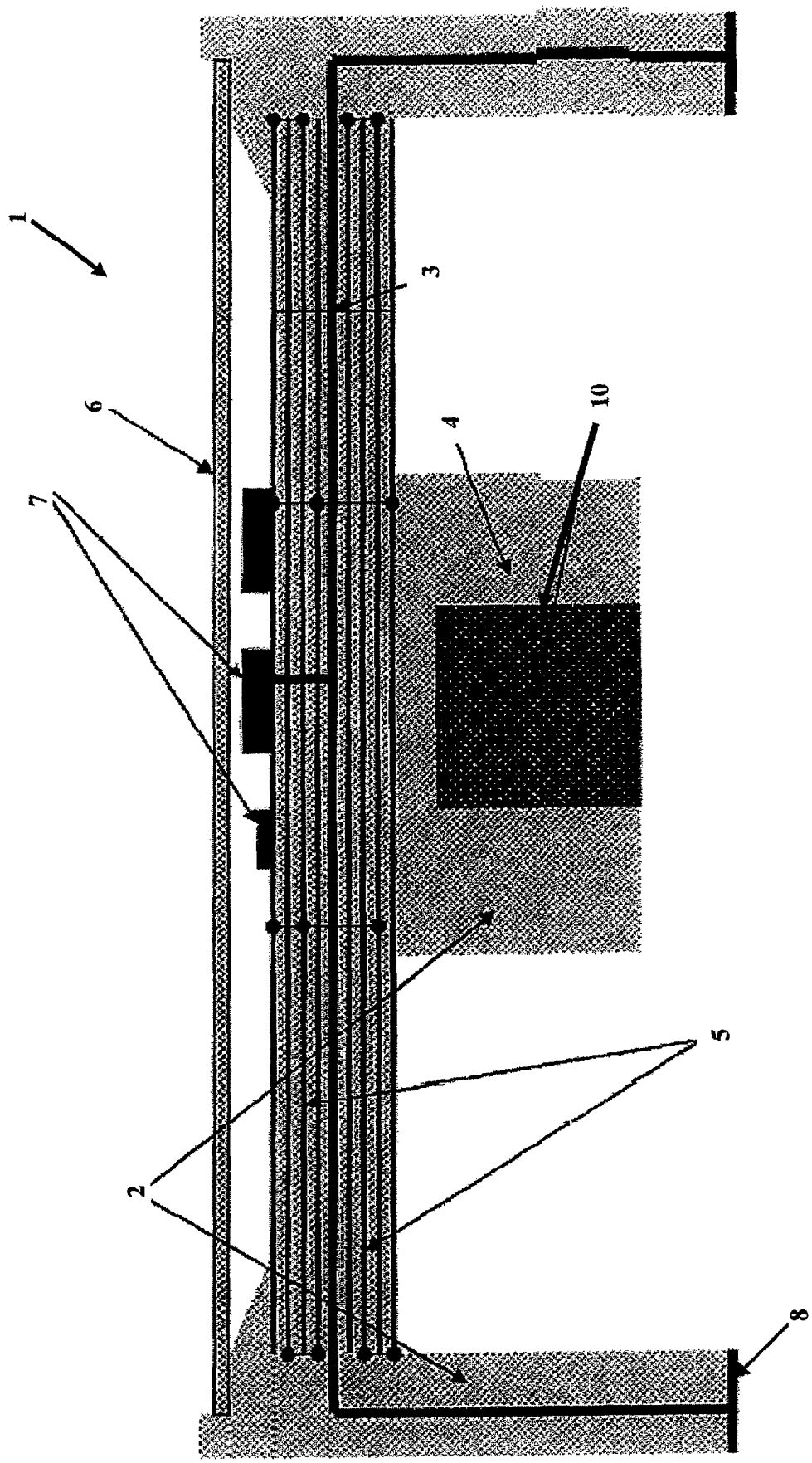
FIG. 6 is a cross-sectional view of a micro-electromechanical package according to a sixth embodiment of the present invention.

With reference now to the embodiment shown in FIG. 6, the micro-electromechanical package 1 according to another exemplary embodiment of the present invention further comprises a weight 10 embedded in the inertial mass 4. The embedded weight 10 may be made of a metal. Each of the previous embodiments which comprise an inertial mass 4 may also comprise a weight 10 embedded in the inertial mass 4. As mentioned above, the efficiency of a vibratory energy scavenger depends much on the seismic mass. In light of the fact that most casing materials (ceramics and plastics) are light weight materials, the efficiency of an energy scavenger device will be significantly improved by inserting a high density metal during the casing manufacturing process.

A method of manufacturing the micro-electromechanical package (1) as described above in relation to FIGS. 1-6 includes forming a micro-electromechanical system (i.e., MEMS) package using a ceramic multi-layering technique or a polymer molding technique.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A micro-electromechanical (MEMS) package, comprising:
  a casing, wherein at least one outer wall of the casing comprises piezoelectric material arranged such that dynamically changing mechanical strain in the at least one outer wall produces an electrical charge; and
  a microelectronic circuit enclosed within the casing, the microelectronic circuit being configured to receive and be powered by the electrical charge.

2. The micro-electromechanical package of claim 1, wherein the microelectronic circuit is mounted on the at least one outer wall of the casing.

3. The micro-electromechanical package of claim 2, wherein the at least one outer wall of the casing comprises an inertial mass formed as part of the casing.

4. The micro-electromechanical package of claim 1, wherein the piezoelectric material comprises embedded electrode layers configured to collect the electrical charge produced by the piezoelectric material.

5. The micro-electromechanical package of claim 1, wherein the casing comprises Aluminum Nitride.

6. The micro-electromechanical package of claim 1, wherein the microelectronic circuit comprises at least one of: a power management circuit, a power storage circuit, and a micro-electromechanical sensor circuit.

7. A method of manufacturing a micro-electromechanical (MEMS) package, comprising:

providing a casing, wherein at least one outer wall of the casing includes a piezoelectric material arranged such that dynamically changing mechanical strain in the at least one outer wall produces an electrical charge;

providing a microelectronic circuit enclosed within the casing, the microelectronic circuit being configured to receive and be powered by the electrical charge; and forming the MEMS package via a ceramic multi-layering technique or a polymer molding technique.

8. The method of claim 7, wherein the microelectronic circuit is mounted on the at least one outer wall of the casing.

9. The method of claim 8, wherein the at least one outer wall is formed to include an inertial mass formed as part of the casing.

10. The method of claim 7, wherein the piezoelectric material comprises embedded electrode layers configured to collect the electrical charges produced by the piezoelectric material.

11. The method of claim 7, wherein the casing is formed to include Aluminum Nitride.

12. The method of claim 7, wherein the microelectronic circuit is formed to include at least one of: a power management circuit; a power storage circuit; and a micro-electromechanical sensor circuit.

13. The micro-electromechanical package of claim 1, wherein the at least one outer wall of the casing comprises an inertial mass formed as part of the casing.

* * * * *